US006180521B1

United States Patent
DeHaven et al.

(12)

(10) Patent No.: US 6,180,521 B1
(45) Date of Patent: Jan. 30, 2001

(54) PROCESS FOR MANUFACTURING A CONTACT BARRIER

(75) Inventors: Patrick W. DeHaven, Poughkeepsie; Anthony G. Domenicucci, New Paltz; Lynne M. Gignac, Beacon, all of NY (US); Glen L. Miles, Essex Junction; Prabhat Tiwari, South Burlington, both of VT (US); Yun-Yu Wang, Poughquag, NY (US); Horatio S. Wildman; Kwong Hon Wong, both of Wappingers Falls, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/225,598

(22) Filed: Jan. 6, 1999

(51) Int. Cl.[7] .................................................. H01L 21/28
(52) U.S. Cl. ........................................... 438/655; 438/656
(58) Field of Search ..................... 438/648, 649, 438/655, 656, 682, 683, 685, FOR 349

(56) References Cited

U.S. PATENT DOCUMENTS

| 5,047,367 | 9/1991 | Wei et al. . |
|---|---|---|
| 5,094,981 | 3/1992 | Chung et al. . |
| 5,229,331 | * 7/1993 | Doan et al. . |
| 5,389,575 | 2/1995 | Chin et al. . |
| 5,482,895 | 1/1996 | Hayashi et al. . |
| 5,510,295 | 4/1996 | Cabral, Jr. et al. . |
| 5,536,676 | 7/1996 | Cheng et al. . |
| 5,567,652 | 10/1996 | Nishio . |
| 5,612,254 | * 3/1997 | Mu et al. . |
| 5,817,572 | * 10/1998 | Chiang et al. . |
| 6,066,507 | * 5/2000 | Rolfson et al. . |

* cited by examiner

Primary Examiner—George Fourson
Assistant Examiner—Joannie A. Garcia
(74) Attorney, Agent, or Firm—Ratner & Prestia; Jay H. Anderson

(57) ABSTRACT

A process for forming a conductive contact having a flat interface. A layer containing niobium and titanium is deposited on a silicon substrate and the resulting structure is annealed in a nitrogen-containing atmosphere at about 500° C. to about 700° C. By this process, a flatter interface between silicide and silicon, which is less likely to cause junction leakage, is formed on annealing. The step of annealing also produces a more uniform bilayer, which is a better barrier against tungsten encroachment during subsequent tungsten deposition. Larger silicide grains are also formed so that fewer grain boundaries are produced, reducing metal diffusion in grain boundaries. The process can be used to form contacts for very small devices and shallow junctions, such as are required for current and future semiconductor devices.

11 Claims, 5 Drawing Sheets

PROCESS FOR MANUFACTURING A CONTACT BARRIER

TECHNICAL FIELD

The present invention relates to the formation of conductive contacts in the fabrication of semiconductor integrated circuits. More particularly, this invention relates to a process for forming a less than 10 nm diffusion barrier with a flat interface, which gives good electrical contact to a shallow junction.

BACKGROUND OF THE INVENTION

The continuing increase in semiconductor device circuit speed and density has been accompanied both by a decrease in the vertical dimensions of devices and by a need for reliable dense wiring. The decrease in vertical dimension has produced shallower device junctions.

In the processing of integrated circuits, individual devices, which are comprised of silicon, are connected into circuits by subsequent metal layers. Great care must be given to the metal-to-silicon interface, because the metal-silicon junction is prone to certain problems that require process attention. Two such problems are high-ohmic connections, which may electrically look like open circuits, and poisoning of the device by the contacting metal.

In manufacturing an interconnect, a contact hole is formed in an insulating layer, typically silicon dioxide, to expose the underlying semiconductor substrate, typically an N+ region set in a P− well, or a P+ region set in an N− well. To form the interconnect, the appropriate metal is deposited in the contact hole by standard techniques. If the metal is placed in direct contact with the semiconductor substrate, the metal can diffuse into the semiconductor during subsequent processing of the device, especially at temperatures above 400° C., which are encountered during device packaging.

Metal silicides are typically used to provide good ohmic contact to device junctions. Titanium silicide ($TiSi_2$) has become the most widely used silicide for self-aligned silicide applications in the ultra large scale integration (ULSI) industry because of its low resistivity, its ability to self-align, and its relatively good thermal stability. Titanium is deposited into the contact hole by standard deposition techniques. Titanium silicide is formed by subsequently heating the substrate and metal to about 500° C. to 700° C.

To minimize junction leakage, the device junction must be kept below the silicide. The distance between the device junction and the silicide is determined by the amount of metal deposited in the contact hole, the amount of silicon consumed during heating, and the planarity of the reaction front during heating. The amount of silicon consumed is determined by the stoichiometry and crystal structure of the silicide formed as well as by the anneal time and anneal temperature. For titanium silicide, the molar ratio of metal to silicon is two to one. The planarity of the silicide reaction front is controlled by many variables, such as the cleanliness of the silicon surface before metal deposition and the reaction temperature. Typical semiconductor fabrication sequences produce non-planar, cusped reaction fronts. Junction depths could be made shallower by using a silicide process that produced a more nearly planar reaction front.

To prevent diffusion, many semiconductor fabrication sequences use a diffusion barrier between the metal and the silicon substrate. In a common process sequence, titanium nitride (TiN) is used as a barrier against attack by tungsten hexafluoride and by fluorine during the deposition of tungsten, a commonly used conductive material, by chemical vapor deposition from tungsten hexafluoride. A preferred process for forming the titanium nitride barrier includes conducting the silicide-forming reaction in a nitrogen-containing atmosphere, such as nitrogen gas, ammonia vapor, or forming gas. Titanium nitride is formed at the same time as titanium silicide.

The topography of the resulting interface between the titanium oxynitride and titanium silicide limits the usefulness of this process in the development of smaller shallow junction devices. The process involves competing reactions in a very narrow region: formation of $TiO_yN_z$ from above and formation of $TiSi_2$ from below. Thus, it is difficult to control the layer thickness of the bilayer, and the titanium oxynitride layer is typically nitrogen deficient. Formation of the titanium silicide layer consumes silicon from the substrate and the layer can be cusped.

The rough interface between titanium silicide and titanium oxynitride makes the titanium oxynitride layer an unreliable barrier against attack during the chemical vapor deposition of tungsten. Penetration of tungsten hexafluoride through the narrow part of the titanium oxynitride layer can lead to tungsten encroachment and ruin the device. Although the barrier properties of the layer can be improved by incorporation of oxygen during deposition of the titanium and the subsequent anneal, the non-uniformity in thickness of the $TiO_yN_z$ layer, which degrades its effectiveness as a barrier, remains a problem.

Diffusion produces spiking of the metal into the semiconductor. Spiking typically extends for less than about 0.5 micron into the semiconductor, and thus is not a particular problem when the device is greater than 0.5 micron thick. For high density circuits in which the device is less than 0.5 micron thick, however, spiking can short the metal to the underlying P− well or N− well, rendering the device inoperative.

In addition, the $TiSi_2$ made by this process is formed as small grains, so that a large number of grain boundaries are created. Grain boundaries can permit diffusion of device-poisoning metal impurities to the silicon substrate. Such diffusion is especially a problem with shallow junction devices, which are more easily poisoned by low concentrations of metal impurities. Therefore, a $TiSi_2$ layer made up of large grains is desirable to reduce diffusion of metal impurities.

Thus, a need exists for a process for forming a barrier layer and a silicide layer in which (1) the interface formed between the silicide layer and the silicon substrate is a flat interface; (2) the barrier layer is uniform in thickness; and (3) the barrier layer material has large grains so that metal impurity diffusion is reduced. In addition, the process should be simple and cost effective, should readily integrate into the procedures currently used to form semiconductor devices, and preferably, should not introduce additional processing steps.

SUMMARY OF THE INVENTION

To meet these and other needs, and in view of its purposes, the present invention provides a process for forming a semiconductor device with electrical interconnections that have low contact resistance and for forming a barrier layer that prevents undesired diffusion into the silicon substrate. The process comprises:

a) depositing a layer of niobium and titanium with a thickness of less than 10 nm on a silicon substrate, with the amount of niobium present in the layer not exceeding 20 atomic percent of the total amount of niobium and titanium present in the layer;

b) annealing the substrate and layer in a nitrogen-containing atmosphere at about 500° C. to about 700° C.; and c) depositing a conductive material on the layer.

The process produces a much flatter interface between the suicides and the silicon substrate than is produced when undoped titanium is used. The flat interface is critical for contacts for very small devices and shallow junctions, such as are required for ULSI shallow junctions. A uniform barrier layer of $(Ti,Nb)O_yN_z$ is formed. This layer is a better barrier against attack by tungsten hexafluoride and fluorine during the chemical vapor deposition of tungsten than conventional barriers.

Although not bound by any explanation or theory, it is believed that a better impurity diffusion barrier is produced because $(Ti,Nb)Si_x$ grains are larger than $TiSi_x$ grains. Larger grains have fewer grain boundaries and it is well known that the grain boundary diffusion rate of an impurity is several orders of magnitude larger than the bulk diffusion rate; therefore, larger grains produce a better impurity diffusion barrier. An efficient impurity diffusion barrier is critical in the production of semiconductor devices, especially for shallow junction devices in which the requirement for impurity control is much higher than for other devices. This feature is important for the development of future devices, in which, due to the smaller size of the device, better control of impurity diffusion will be required.

In another embodiment, the invention is a contact in which the interface between the silicon substrate and its adjacent layer is flat. A flat interface is important for device contact, such as in a shallow junction device contact. It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The invention is a process for forming a flat interface between a silicon substrate and a $(Ti,Nb)Si_x$—$(Ti,Nb)O_yN_z$ layer for use in self-aligned silicide technology and as a contact via fill. The layer serves as a barrier against attack on the silicon substrate during subsequent processing steps, such as attack by tungsten hexafluoride and fluorine during subsequent chemical vapor deposition of tungsten from tungsten hexafluoride.

Figure 1:
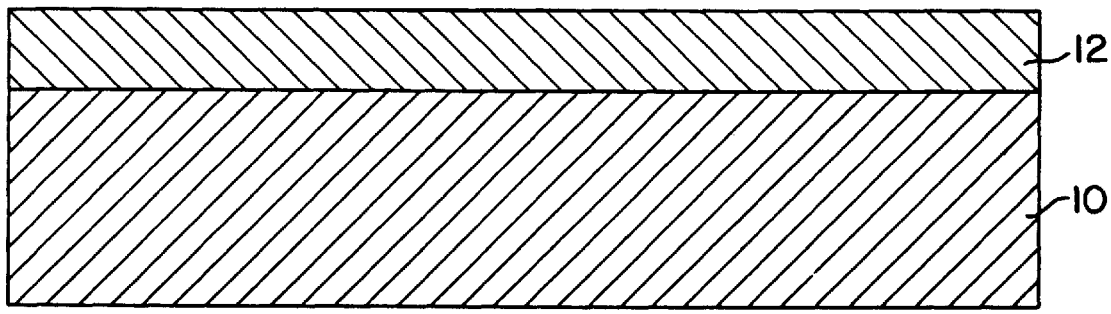
FIG. 1 shows a cross-section of a silicon substrate with a titanium-niobium layer formed on the substrate before anneal.

Referring to FIG. 1, silicon substrate 10 may be either mono-crystalline or poly-crystalline silicon. Using processes well known to those skilled in the art, such as are described, for example, in *The Science and Engineering of Microelectronic Fabrication*, S. A. Campbell, Oxford University Press, New York, 1996, the silicon substrate can be provided, for example, by formation of a contact hole, or via, in the dielectric layer over the region of a silicon substrate at which a connection is desired. Typically, the contact hole is formed over an N+ region set in a P− well or a P+ region set in an N− well.

Titanium-niobium layer 12 is deposited on the surface of silicon substrate 10 by any one of several techniques known in the art. Deposition techniques include, for example, physical vapor deposition, chemical vapor deposition, plasma-enhanced chemical vapor deposition, flash evaporation, sputtering, electron beam evaporation, and ion assisted deposition. The apparatus and techniques for vacuum deposition are well known to those skilled in the art.

The titanium and the niobium may be deposited from different sources or from a source of titanium that also contains niobium. For example, if the layer is deposited by sputtering, a sputtering target of titanium and niobium is prepared such that a titanium layer containing the desired atomic percentage of niobium is deposited on the silicon substrate. Alternatively, the layer can be deposited by co-sputtering titanium and niobium such that a titanium film containing the desired atomic percentage of niobium is deposited on the silicon substrate. When the physical vapor deposition process of evaporation is used, the titanium and niobium are deposited from two different sources at appropriate rates to achieve the desired atomic percentage of niobium. Other processes known in the art may also be used to deposit titanium-niobium layer 12.

The amount of niobium present in titanium-niobium layer 12 should be at least 1 atomic percent and not exceed about 20 atomic percent of the total amount of niobium and titanium present in the layer. The layer preferably contains at least 1 to about 10 atomic percent niobium, more preferably about 3 to about 7 atomic percent niobium, and most preferably about 5 atomic percent niobium. Titanium-niobium layer 12 typically has a thickness of about 5 nm to about 10 nm, preferably about 7 nm.

Following deposition of titanium-niobium layer 12, substrate 10 and layer 12 are annealed in a nitrogen-containing atmosphere, such as ammonia vapor, forming gas (a mixture of nitrogen and hydrogen), or nitrogen gas. The time and temperature are selected to ensure formation of the $(Ti,Nb)Si_x$ and $TiO_yN_z$ layers. The annealing step may be conducted at about 500° C. to about 700° C. for about 0.5 hr to about 2 hr. Above about 700° C., agglomeration of the $(Ti,Nb)Si_x$ is observed. Preferably, the annealing step is conducted at about 550° C. for about 0.5 hr. The anneal may be completed by processes well known to those skilled in the art, such as in a conventional annealing furnace or by rapid thermal anneal.

Figure 2:
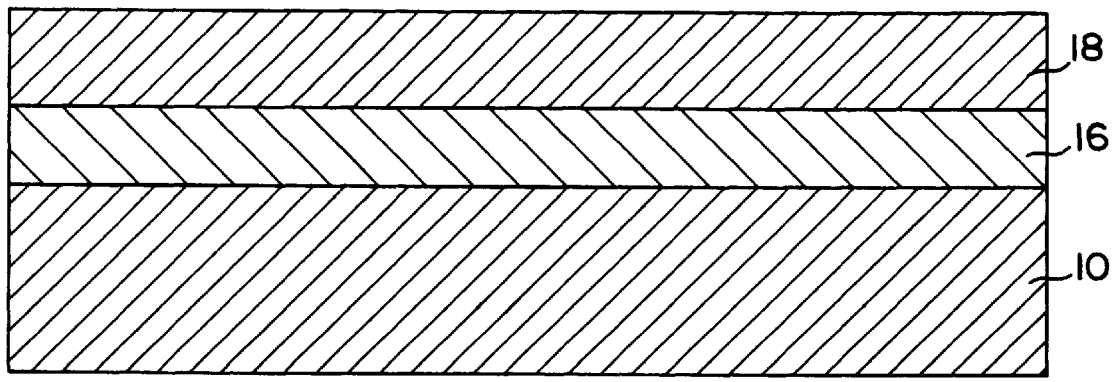
FIG. 2 shows a cross-section of the multi-layer structure formed on anneal.

FIG. 2 shows a cross-section of the multi-layer structure formed on anneal. The multi-layer structure consists of silicon substrate 10, $(Ti,Nb)Si_x$ layer 16, and $(Ti,Nb)O_yN_z$ layer 18. During the initial stages of anneal, the titanium present in titanium-niobium layer 12 removes any silicon dioxide present on the surface of silicon substrate 10. Generally, this oxide layer is only about 0.1 to 0.5 nm (1 to 5 Å) thick. Silicon dioxide dissolves into the titanium. The oxygen is subsequently rejected by the growing silicide layer into TiO$_y$N$_z$ layer 18.

The interface between silicon substrate 10 and (Ti,Nb)Si$_x$ layer 16 is flat, having a roughness of about 1.2 nm. In comparison, the interface between TiSi and a silicon substrate produced by annealing a layer of undoped titanium and a silicon substrate has 3.3 nm roughness. This flat interface of niobium doped silicide allows better control of the thickness of the titanium silicide layer. In addition, the top of layer 16 is more uniform, producing better barrier properties.

Because niobium and titanium have a similar atomic radii and similar chemical properties, the presence of niobium does not greatly alter the crystal structure of either the titanium silicide or the titanium oxynitride. At a low concentration of niobium (1–20 atomic percent), niobium can replace titanium without changing the crystal structure of the material. The grain size of (Ti,Nb)Si$_x$ is much larger, however, than that of TiSi$_x$. This larger grain size produces better barrier properties because the diffusion rate for impurities at grain boundaries is several orders of magnitude higher than the diffusion rate in the bulk material. X-ray diffraction indicates that the crystalline structure of the (Ti,Nb)Si$_x$ is similar to that of TiSi$_2$. (Ti,Nb) Si$_x$ layer 16 is typically slightly more than half as thick as titanium-niobium layer 12. (Ti,Nb)Si$_x$ layer 16 typically has a thickness of about 3 nm to about 10 nm, preferably about 3 nm to about 7 nm. Most preferably, layer 16 is about 4 nm to about 7 nm thick. When layer 12 is about 9 nm thick, silicide layer 16 is typically about 5 nm thick. X-ray diffraction indicates that the (Ti,Nb)S$_x$ has a structure similar to that of TiSi$_2$, which suggests that "x" most likely has a value of about two.

The titanium in titanium-niobium layer 12 reacts with nitrogen in the nitrogen-containing atmosphere and the oxygen that was present on the surface of the layer to form (Ti,Nb)O$_y$N$_z$ layer 18. Due to the flat interface between silicon substrate 10 and (Ti,Nb)Si$_x$ layer 16, (Ti,Nb)O$_y$N$_z$ layer 18 is very uniform. Consequently, layer 18 is a reliable barrier against attack by metals and by fluorine during subsequent processing steps.

(Ti,Nb)O$_y$N$_z$ layer 18 is typically slightly less than half as thick as titanium-niobium layer 12. Titanium oxynitride (tioxynitride) layer 18 typically has a thickness of about 2 nm to less than 10 nm, preferably about 2 nm to about 8 nm. More preferably, the layer is about 3 nm to about 7 nm thick. When titanium-niobium layer 12 is about 9 nm thick, (Ti,Nb)O$_y$N$_z$ layer 18 is typically about 5 nm thick.

The values of "y" and "z" depend on the reaction conditions and typically vary across the cross-section of the layer 18. Typically, the amount of oxygen near the interface with (Ti,Nb)Si$_x$ layer 16 is greater than the amount of oxygen at the surface, and the amount of nitrogen is greater at the surface than the amount of nitrogen near the interface with layer 16.

After anneal, it is unnecessary to remove any of the layers formed on anneal. A conductive material can be deposited directly on top of the interface by processes well known to those skilled in the art. Typical conductive materials include, for example, tungsten, aluminum, copper, gold, tantalum, aluminum-copper alloy, and aluminum-silicon-copper alloy. A preferred conductive material is tungsten, which may be deposited by chemical vapor deposition of tungsten hexafluoride (WF$_6$).

INDUSTRIAL APPLICABILITY

The process of the present invention is simple and cost-effective. It may be readily integrated into present semiconductor fabrication techniques that currently use titanium silicide layers formed from undoped titanium. The invention can be used in the manufacture of semiconductor devices, which are used in, for example, digital computers. The process produces a flat interface for a tungsten barrier plug film, which provides an improved plug for ULSI shallow junctions. The junctions can be used to form the source-drain elements for semiconductor devices. The advantageous properties of the present invention can be observed by reference to the following example which illustrates, but does not limit, the invention.

EXAMPLE

This example describes preparation of an interface by the process of the invention. Silicon substrate 10 was undoped monocrystalline silicon about 0.7 mm thick. Doped silicon and polycrystalline silicon, typically an N+ region set in a P− well or a P+ region set in an N− well, can be used. A niobium-containing titanium layer was deposited on a silicon substrate by co-evaporation. The layer contained atomic percent niobium and was 10 nm thick. As a control, a titanium layer was deposited on a silicon substrate by evaporation. Each substrate was annealed at 550° C. for 0.5 hr in nitrogen gas. The anneal was conducted in a conventional annealing furnace.

Each sample was analyzed by TEM imaging and microbeam analysis. In cross-section, each sample shows a two-layer structure on the silicon substrate. X-ray diffraction shows that the crystal structure of the bottom layer (the layer in contact with the silicon substrate) in each sample has a crystal structure similar to that of TiSi$_2$ (C49 phase).

Figure 3:
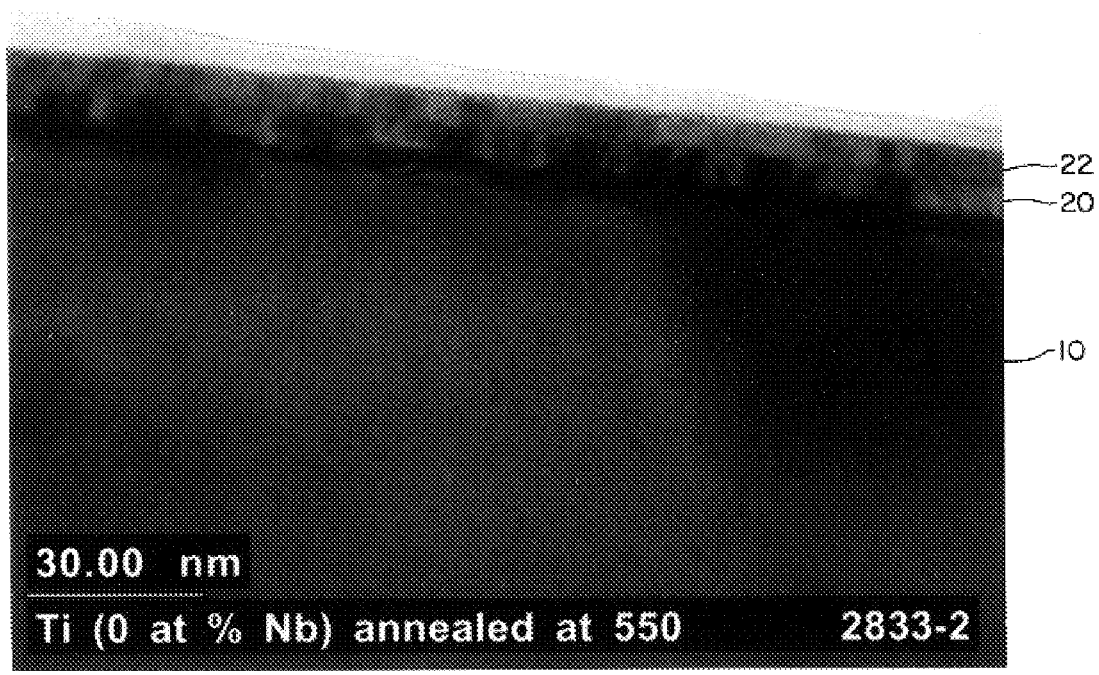
FIG. 3 is low magnification transmission electron microscope (TEM) image of the structure formed by annealing a layer of titanium on a silicon substrate in a nitrogen environment.
Figure 4:
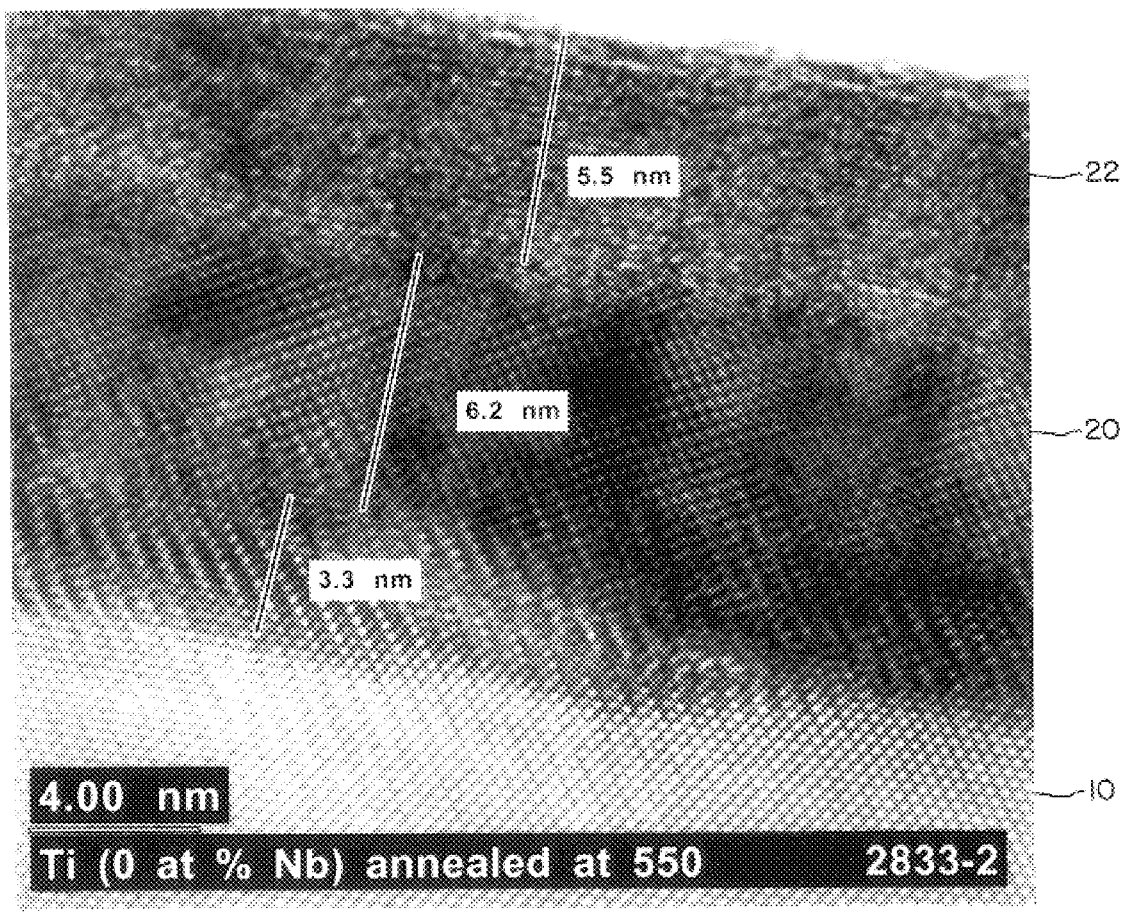
FIG. 4 is high magnification TEM image of the structure formed by annealing a layer of titanium on a silicon substrate in a nitrogen environment.

FIG. 3 shows a low magnification TEM image of the multi-layer structure formed on annealing the layer of undoped titanium on the silicon substrate. FIG. 4 shows a high magnification TEM image of the same structure. These Figures show silicon substrate 10, TiSi$_x$ layer 20, and TiO$_y$N$_z$ layer 22.

Figure 5:
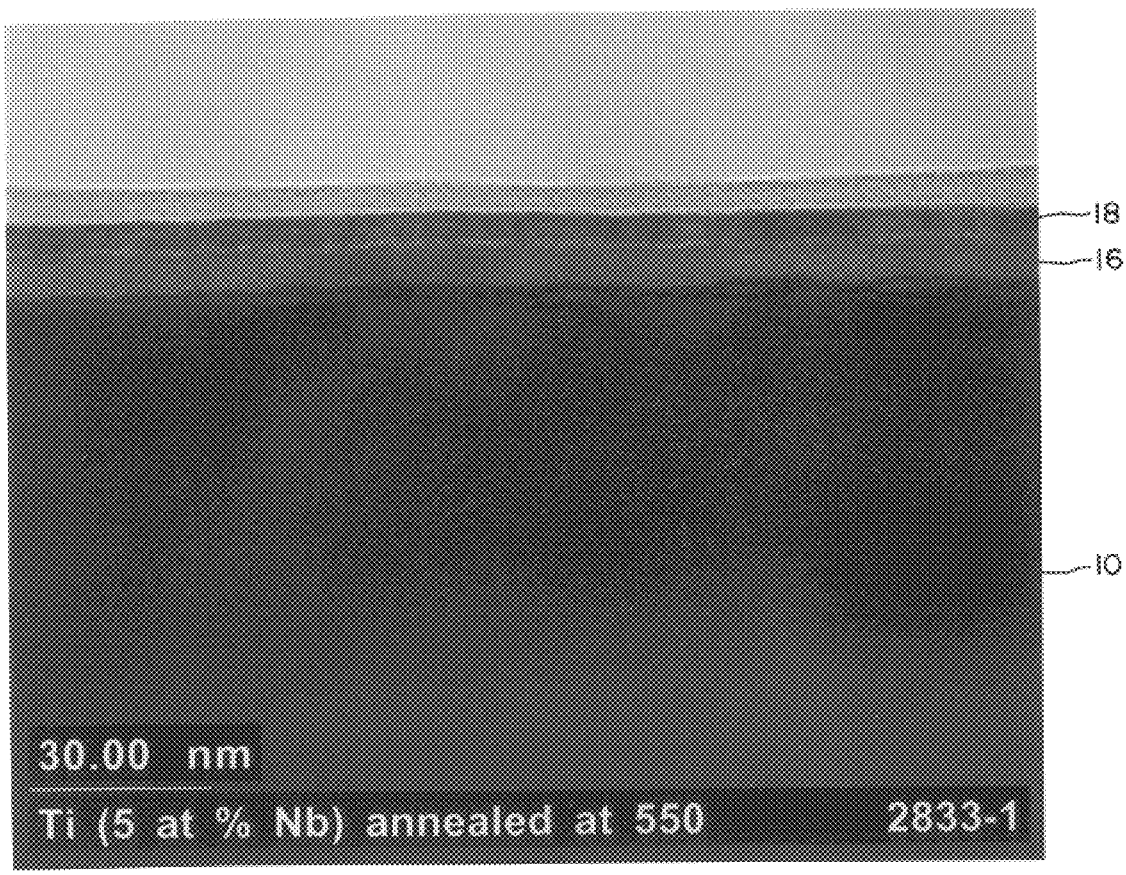
FIG. 5 is low magnification TEM image of the structure formed by annealing a layer of titanium containing 5% niobium on a silicon substrate in a nitrogen environment.
Figure 6:
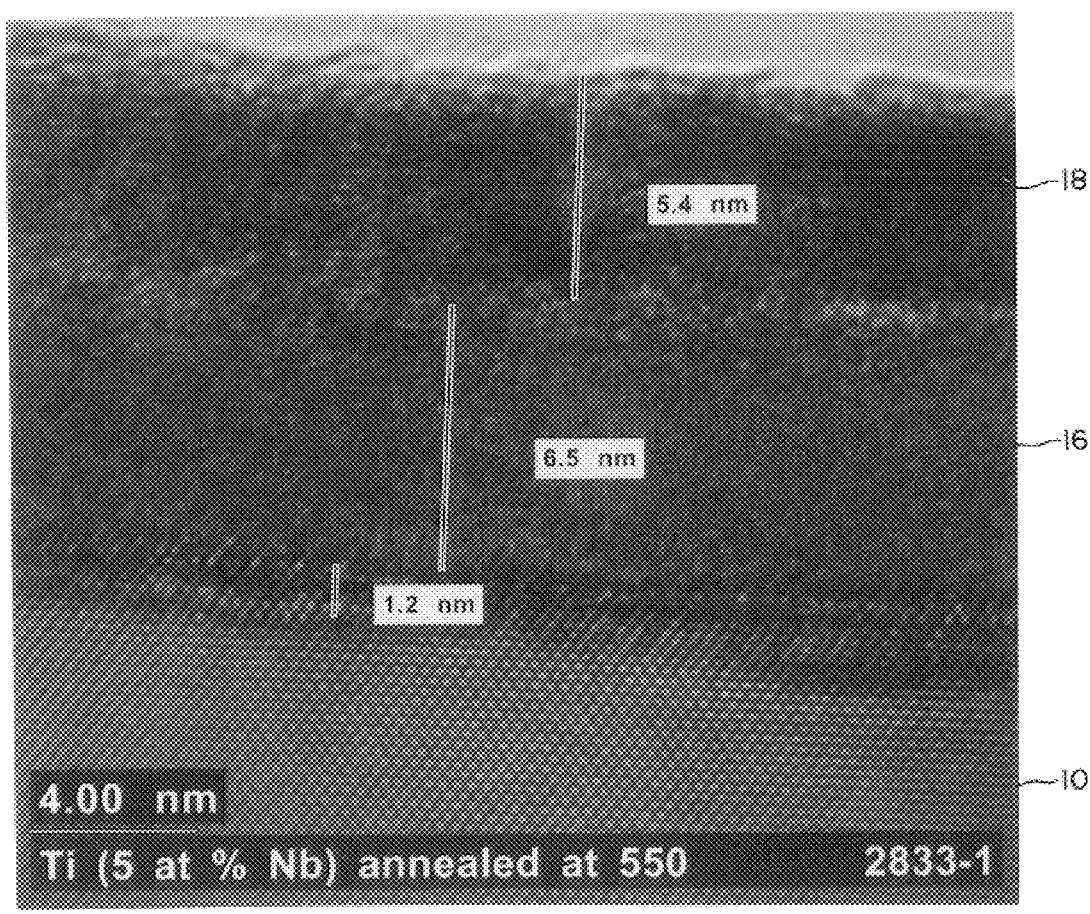
FIG. 6 is high magnification TEM image of the structure formed by annealing a layer of titanium containing 5% titanium on a silicon substrate in a nitrogen environment.

FIG. 5 shows a low magnification TEM image of the multi-layer structure formed by annealing the layer of titanium containing 5% niobium on the silicon substrate for 0.5 hr. FIG. 6 shows a high magnification TEM image of the same structure. These Figures show silicon substrate 10, (Ti,Nb)Si$_x$ layer 16, and (Ti,Nb)O$_y$N$_z$ layer 18.

Referring to FIG. 4, in the undoped sample, the surface roughness between TiSi$_x$ layer 20 and silicon substrate 10 is about 3.3 nm. Referring to FIG. 6, in the niobium doped sample, the surface roughness between (Ti,Nb)Si$_x$ layer 16 and silicon substrate 10 is about 1.2 nm. This smooth interface in the niobium doped sample is important to prevent any junction leakage, especially for shallow junctions. Because of this smooth interface, (Ti,Nb)O$_y$N$_z$ layer 18 is more uniform than undoped TiO$_y$N$_z$ layer 22, producing a better barrier against tungsten hexafluoride during the chemical vapor deposition of tungsten. Both Auger and nano-probe analytical TEM with energy dispersive X-ray analysis indicate that the niobium is evenly distributed in both the (Ti,Nb)O$_y$N$_z$ layer and the (Ti,Nb)Si$_x$ layer of the doped sample.

The TiSi$_x$ crystal is smaller than the (Ti,Nb)Si$_x$ crystal, producing multiple grain boundaries across the film. Referring to FIG. 3, these grain boundaries are visible as the vertical dark lines across TiSi$_x$ layer 20. Referring to FIG. 5, fewer grain boundaries are apparent in (Ti,Nb)Si$_x$ layer 16. Grain boundaries are possible sources of impurity diffusion. In the niobium doped sample, the silicide grains are larger, so that there are fewer grain boundaries across the film. The (Ti,Nb)Si$_x$ layer of the niobium doped sample should be a better barrier against impurity diffusion than TiSi$_x$ layer 20, the corresponding layer in the undoped sample.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A contact comprising, in order:

a) a silicon substrate;

b) a silicide layer comprising titanium, niobium, and silicon and at least 1 atomic percent to about 20 atomic percent niobium based on the total amount of niobium and titanium present in the silicide layer; and c) a niobium-containing titanium oxynitride layer.

2. The contact of claim 1 in which the interface between the silicon substrate and the silicide layer has a roughness of about 1.2 nm or less.

3. The contact of claim 2 in which:

the silicon substrate is one of an N+ region set in a P− well and a P+ region set in an N− well;

the silicide layer is about 3 nm to 12 nm thick and comprises at least 3 atomic percent to about 7 atomic percent niobium based on the total amount of niobium and titanium present in the silicide layer; and the titanium oxynitride layer is about 2 nm to about 8 nm thick.

4. The contact of claim 1 in which the silicide layer comprises at least 3 atomic percent to about 7 atomic percent niobium based on the total amount of niobium and titanium present in the silicide layer.

5. The contact of claim 1 in which the titanium oxynitride layer is uniformly thick.

6. The contact of claim 1 further comprising:

d) a layer of conductive material adjacent to the titanium oxynitride layer and opposite the silicide layer.

7. The contact of claim 6 in which the conductive material is selected from the group consisting of tungsten, aluminum, copper, gold, tantalum, aluminum-copper alloy, and aluminum-silicon-copper alloy.

8. The contact of claim 7 in which the conductive material is tungsten.

9. The contact of claim 6 in which the interface between the silicon substrate and the silicide layer has a roughness of about 1.2 nm or less.

10. The contact of claim 9 in which the titanium oxynitride layer is uniformly thick.

11. The contact of claim 10 in which:

the silicon substrate is one of an N+ region set in a P− well and a P+ region set in an N− well;

the silicide layer is about 3 nm to 12 nm thick and comprises at least 3 atomic percent to about 7 atomic percent niobium based on the total amount of niobium and titanium present in the silicide layer; and the titanium oxynitride layer is about 2 nm to about 8 nm thick.

* * * * *